United States Patent
Mc Connell et al.

(10) Patent No.: US 6,297,995 B1
(45) Date of Patent: Oct. 2, 2001

(54) CIRCUIT CONFIGURATION WITH A TEMPERATURE-DEPENDENT SEMICONDUCTOR COMPONENT TEST AND REPAIR LOGIC CIRCUIT

(75) Inventors: Roderick Mc Connell; Detlev Richter, both of München (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/440,721

(22) Filed: Nov. 15, 1999

(30) Foreign Application Priority Data

Nov. 13, 1998 (DE) .............................................. 198 52 430

(51) Int. Cl.[7] .................................................... G11C 11/22
(52) U.S. Cl. .......................... 365/201; 365/145; 365/200
(58) Field of Search ................................ 365/51, 63, 200, 365/201, 145, 241

(56) References Cited

U.S. PATENT DOCUMENTS 5,406,212   4/1995   Hashinaga et al. .

6,157,585 * 12/2000   Kim ....................................... 365/145

FOREIGN PATENT DOCUMENTS 715 176 A2   6/1996   (EP) .

OTHER PUBLICATIONS

"CMOS Sensors for On–Line Thermal Monitoring of VLSI Circuits", Vladimir Szekely et al., IEEE transactions on very large scale integration (VLSI) systems, vol. 5, No. 3, Sep. 1997.

* cited by examiner

*Primary Examiner*—Terrell W. Fears
(74) *Attorney, Agent, or Firm*—Herbert L. Lerner; Laurence A. Greenberg; Werner H. Stemer

(57) ABSTRACT

A circuit configuration with a temperature-dependent semiconductor component self-test and repair logic circuit, in which at least one temperature sensor is provided in a semiconductor chip having a semiconductor component. In addition, the semiconductor component is connected in the semiconductor chip with the self-test and repair logic circuit.

8 Claims, 1 Drawing Sheet

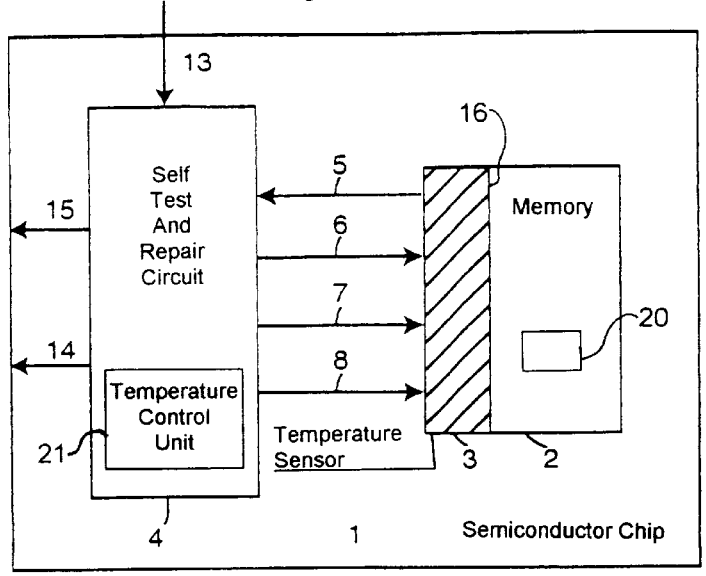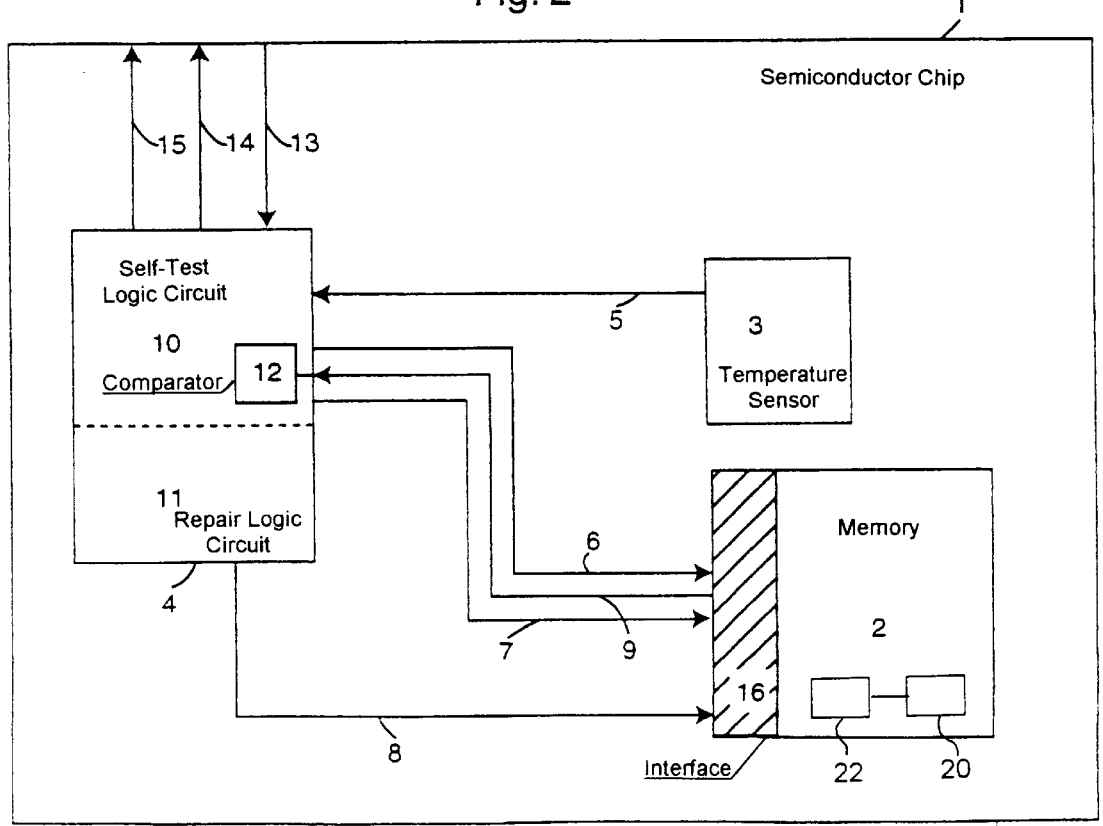

CIRCUIT CONFIGURATION WITH A TEMPERATURE-DEPENDENT SEMICONDUCTOR COMPONENT TEST AND REPAIR LOGIC CIRCUIT

BACKGROUND OF THE INVENTION

1. Field of the Invention

This invention concerns a circuit configuration with a temperature-dependent semiconductor component test and repair logic circuit, in which at least one temperature sensor is provided in a semiconductor chip having a semiconductor component.

Before being delivered to customers, semiconductor components, such as semiconductor memories, are tested as to whether they still operate properly at specific temperatures. This was previously done by placing a semiconductor memory in a tester in which the temperature applied to the semiconductor memory can be set externally. As soon as this temperature, for example 87° C. is attained, the semiconductor memory in the tester is tested for its functionality through the application of specific test signals applied to it.

If the temperature in the tester cannot be regulated, the test results are often unsatisfactory because certain characteristics of a semiconductor memory are strongly dependent on the temperature. The possibility therefore definitely exists that at the test temperature, for example above 87° C., it is not possible to detect reliably every possible defect in the semiconductor memory.

From the IEEE article "TRANSACTION ON VERY LARGE SCALE INTEGRATION (VLSI) SYSTEMS", Vol. 5, No. 3, September 1997, pp 270–276, CMOS sensors are known which consist of MOS circuits and which can be installed in integrated circuits for recording temperature. This publication does not, however, deal with the testing of memories.

Finally, Published, Non-Prosecuted German Patent Application DE 198 28 192 A1 discloses a circuit configuration for controlling the chip temperature of a semiconductor memory to be measured, in which circuit configuration at least one temperature sensor is provided in the chip having the semiconductor memory. In the chip, the semiconductor memory and the temperature sensor are connected with a temperature control unit. This enables a chip temperature of the semiconductor memory to be set to different values so that good test coverage can be achieved even if particular characteristics of the semiconductor memory are strongly dependent on temperature.

However, this prior art circuit configuration does not make possible the immediate repair of the semiconductor memory in the process of being tested. On the contrary, a repair of the semiconductor memory cannot be performed until the test has been completed, which repair can be carried out, for example, using normal laser fuses which are blown in the semiconductor memory according to the defective sites located during the test.

Another possibility consists therein, that a semiconductor memory is tested and repaired at every start-up of the semiconductor memory by a test and repair logic circuit provided on the chip. In other words, the repair is carried out directly on the chip having the semiconductor memory. A procedure of this kind can, however, deliver unsatisfactory results because in this case the semiconductor memory is not tested at the respective operating temperature required.

SUMMARY OF THE INVENTION

It is accordingly an object of the invention to provide a circuit configuration with a temperature-dependent semiconductor component test and repair logic circuit which overcomes the above-mentioned disadvantages of the prior art devices of this general type, in which a semiconductor component of the configuration can be repaired easily after being tested at different temperatures.

With the foregoing and other objects in view there is provided, in accordance with the invention, a circuit configuration, which contains a semiconductor chip, including: a semiconductor component; a self-test and repair logic circuit connected to the semiconductor component; and at least one temperature sensor connected to the self-test and repair logic circuit, the at least one temperature sensor measuring a temperature of the semiconductor chip.

This object is achieved according to the invention in a circuit configuration of the kind named at the beginning, in that the semiconductor component, the temperature sensor and the self-test and repair logic circuit are connected to each other in the semiconductor chip.

Thus in addition to the semiconductor component and the temperature sensor, the circuit configuration also contains the self-test and repair logic circuit within the semiconductor chip so that not only can the temperature be set for the test procedure—as in the circuit configuration according to the Published, Non-Prosecuted German Patent Application DE 198 28 192 A1 but also a repair can be simply carried out after the test procedure at every start-up or at other suitable times. The repair, i.e. the replacement, for example, of defective memory sites in a semiconductor memory as the semiconductor component, can be carried out either permanently and statically by blowing appropriate laser fuses, or temporarily by connecting redundant memory elements in separate registers.

In this way the invention makes possible an advantageous combination of a repair using a self-test and repair logic circuit, with a temperature-dependent test using a temperature sensor contained in the semiconductor chip having the semiconductor component.

In a concrete example the circuit configuration according to the invention contains a semiconductor memory as the semiconductor component. The semiconductor chip having the semiconductor memory additionally includes the temperature sensor, for example a temperature-dependent oscillator, and the self-test and repair logic circuit (BIST). If a "self-repair" of the semiconductor memory should now be performed by the circuit configuration, its temperature is first checked using the temperature sensor. If the measured temperature is not suitable for the test, the BIST switches on a temperature-modification mode. The self-test begins as soon as the temperature sensor reports that the appropriate temperature has been reached. If during the test the temperature again deviates from the appropriate temperature, the self-test is aborted and the temperature-modification mode is switched on briefly once again. In this way it can be ensured that the semiconductor memory is tested at the appropriate temperature.

After all defective memory cells have been located, an appropriate repair configuration is worked out in the BIST in order then to perform the repair, for example by setting a register for redundant memory cells or through programming electrically settable fuse blocks. As soon as the repair of the semiconductor memory is complete it is reported as free of errors. If such a repair is not possible, this can also be displayed as information.

Other features which are considered as characteristic for the invention are set forth in the appended claims.

Although the invention is illustrated and described herein as embodied in a circuit configuration with a temperature-dependent semiconductor component test and repair logic circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, block circuit diagram of a first exemplary embodiment of a circuit configuration according to the invention; and FIG. 2 is a block circuit diagram of a second exemplary embodiment of the circuit configuration.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 1 thereof, there is shown a semiconductor chip 1 as an example of a semiconductor component in which are integrated a semiconductor memory 2, a temperature sensor 3 near or immediately adjacent to it, and a self-test and repair logic circuit 4. The temperature sensor 3, which can consist of the above-mentioned, known CMOS circuit, measures a temperature of the semiconductor chip 1 in the area of the semiconductor memory 2 and communicates the temperature to the self-test and repair logic circuit 4, as illustrated by an arrow 5. If the temperature of the semiconductor chip 1 determined by the temperature sensor 3 is within the range of the test temperature, the self-test and repair logic circuit 4 initiates a test mode, as indicated by an arrow 6. If the temperature of the semiconductor chip 1 determined by the temperature sensor 3 lies outside the range of the test temperature, the self-test and repair logic circuit 4 either raises or lowers the temperature of the semiconductor chip 1 (see arrow 7) via a temperature control unit 21.

By use of the self-test and repair logic circuit 4 it is easily possible to set different ranges for the test temperature so that the semiconductor memory 2 can be tested for reliability at different test temperatures. Thus it is possible in this way to achieve broad test coverage so that even the characteristics of the semiconductor memory 2 which is strongly temperature-dependent can be reliably tested.

If the test of the semiconductor memory 2 performed through the self-test and repair logic circuit 4 detects a fault, which can consist, for example, of locating one or several defective memory cells, the self-test and repair logic circuit 4 calculates a repair configuration and then carries out the repair in that, for example, fuses are blown of a redundant memory cell array 20 in the semiconductor memory 2. This repair is illustrated through an arrow 8.

After completion of the repair the semiconductor 2 is enabled as error-free (arrow 14) or is reported externally as irreparable (arrow 15).

The above test and repair procedure at the semiconductor memory 2 can be triggered at any time through a BIST start signal injected into the semiconductor chip 1 (see arrow 13) so that it is easily possible to perform this test and repair procedure at every start-up of the semiconductor memory 2, or at other suitable times. As already mentioned, instead of a static repair a temporary repair using separate electrical memory elements in the form of registers can also be performed if required.

FIG. 2 shows a further exemplary embodiment of the circuit configuration according to the invention, in which the temperature sensor 3 is provided in the vicinity of the semiconductor memory 2. In this case an interface 16 of the semiconductor memory 2 (which interface is, of course, also present in the exemplary embodiment of FIG. 1) is illustrated separately. The temperature sensor can have, for example, temperature ranges of: up to 25° C., 25° C. to 75° C., 75° C. to 125° C., and over 125° C. These four temperature ranges can then be represented digitally, for example, by "00", "01", "10" and "11" respectively. Corresponding digital values are supplied over a 2-bit bus (see arrow 5) to the self-test and repair logic circuit 4 consisting of a self-test logic circuit 10 and a repair logic circuit 11. The initiation of a test mode then takes place over a bus (see arrow 6), insofar as the reported temperature lies within the range specified by the self-test logic circuit 10. If this is not the case, the chip temperature is modified accordingly (see arrow 7).

The data recorded during a test in the semiconductor memory 2 are fed over a bus (see arrow 9) to the self-test logic circuit 10 where they are tested in a comparator 12. If errors are detected, appropriate redundant memory cells 20 are set in the semiconductor memory 2 (see arrow 8). In this way it is possible to link the redundant memory cells 20 in through setting corresponding registers 22. Another possibility is for the self-test and repair logic circuit 4 to set the redundant memory cells 20 through programming non-volatile memory elements (for example EPROM, flash memory, electrical fuses) of the redundant memory cells 20.

The circuit configuration according to the invention can be advantageously used in semiconductor memories such as DRAMs etc. However, it can also be used in other semiconductor components which must be subjected to temperature-dependent tests and where redundant components exist.

We claim:

1. A circuit, comprising:
a semiconductor chip, including:
a semiconductor component;
a self-test and repair logic circuit connected to said semiconductor component; and
at least one temperature sensor connected to said self-test and repair logic circuit, said at least one temperature sensor measuring a temperature of said semiconductor chip.

2. The circuit according to claim 1, wherein said self-test and repair logic circuit contains a temperature control unit.

3. The circuit according to claim 1, wherein said temperature control unit switches to a temperature modification mode if a value recorded by said at least one temperature sensor for the temperature of said semiconductor chip lies outside a test temperature range.

4. The circuit according to claim 1, wherein said self-test and repair logic circuit has a repair logic circuit and a microprocessor functioning as a self-test logic circuit.

5. The circuit according to claim 4, wherein said self-test logic circuit has a comparator.

6. The circuit according to claim 1, wherein said semiconductor component is a semiconductor memory having redundant memory cells, said self-test and repair logic circuit sets said redundant memory cells in said semiconductor memory.

7. The circuit according to claim 6, wherein said semiconductor memory has registers, and said self-test and repair logic circuit connects in said redundant memory cells through setting said registers.

8. The circuit according to claim 6, wherein said redundant memory cells have non-volatile memory elements, and said self-test and repair logic circuit sets said redundant memory cells through programming of said non-volatile memory elements.

* * * * *